(12) United States Patent
Koh

(10) Patent No.: US 7,623,354 B2
(45) Date of Patent: Nov. 24, 2009

(54) FOLDING USB DRIVE

(75) Inventor: Wei Koh, Irvine, CA (US)

(73) Assignee: Kingston Technology Corporation, Fountain Valley, CA (US)

( * ) Notice: Subject to any disclaimer, the term of this patent is extended or adjusted under 35 U.S.C. 154(b) by 370 days.

(21) Appl. No.: 11/238,949

(22) Filed: Sep. 29, 2005

(65) Prior Publication Data

US 2007/0070611 A1    Mar. 29, 2007

(51) Int. Cl.
*H05K 1/18*   (2006.01)
(52) U.S. Cl. .................. 361/764; 361/737; 361/749; 174/254
(58) Field of Classification Search ......... 361/736–737, 361/752–753; 439/65–66, 660–663; 174/254–255
See application file for complete search history.

(56) References Cited

U.S. PATENT DOCUMENTS

| | | | |
|---|---|---|---|
| 6,121,676 A * | 9/2000 | Solberg | 257/686 |
| 6,172,418 B1 * | 1/2001 | Iwase | 257/723 |
| 6,208,521 B1 * | 3/2001 | Nakatsuka | 361/749 |
| 6,456,500 B1 * | 9/2002 | Chen | 361/752 |
| 6,743,030 B2 * | 6/2004 | Lin et al. | 439/131 |
| 6,879,047 B1 | 4/2005 | Heo | |
| 6,884,653 B2 | 4/2005 | Larson | |
| 6,908,792 B2 * | 6/2005 | Bruce et al. | 438/110 |
| 7,391,006 B2 * | 6/2008 | Cheng et al. | 250/221 |

* cited by examiner

*Primary Examiner*—Tuan T Dinh
(74) *Attorney, Agent, or Firm*—Sawyer Law Group, P.C.

(57) ABSTRACT

Provided is a memory device comprising a circuit assembly including a flexible substrate and at least one flash memory chip mounted thereupon. The flexible substrate has upper and lower surfaces and a flash memory chip is preferably mounted on at least one the upper and lower surfaces. The flash memory chip may be configured as one of a thin small outline package (TSOP) package device, a very very small outline package (WSOP) package device, and a chip on board (COB) device. The memory device may further comprise a hollow housing body having a hollow interior compartment sized and configured to receive the circuit assembly therewithin. A universal series bus (USB) connector may be mounted on a free end of the flexible substrate and is preferably configured to electrically connect the memory device to an electric device.

20 Claims, 3 Drawing Sheets

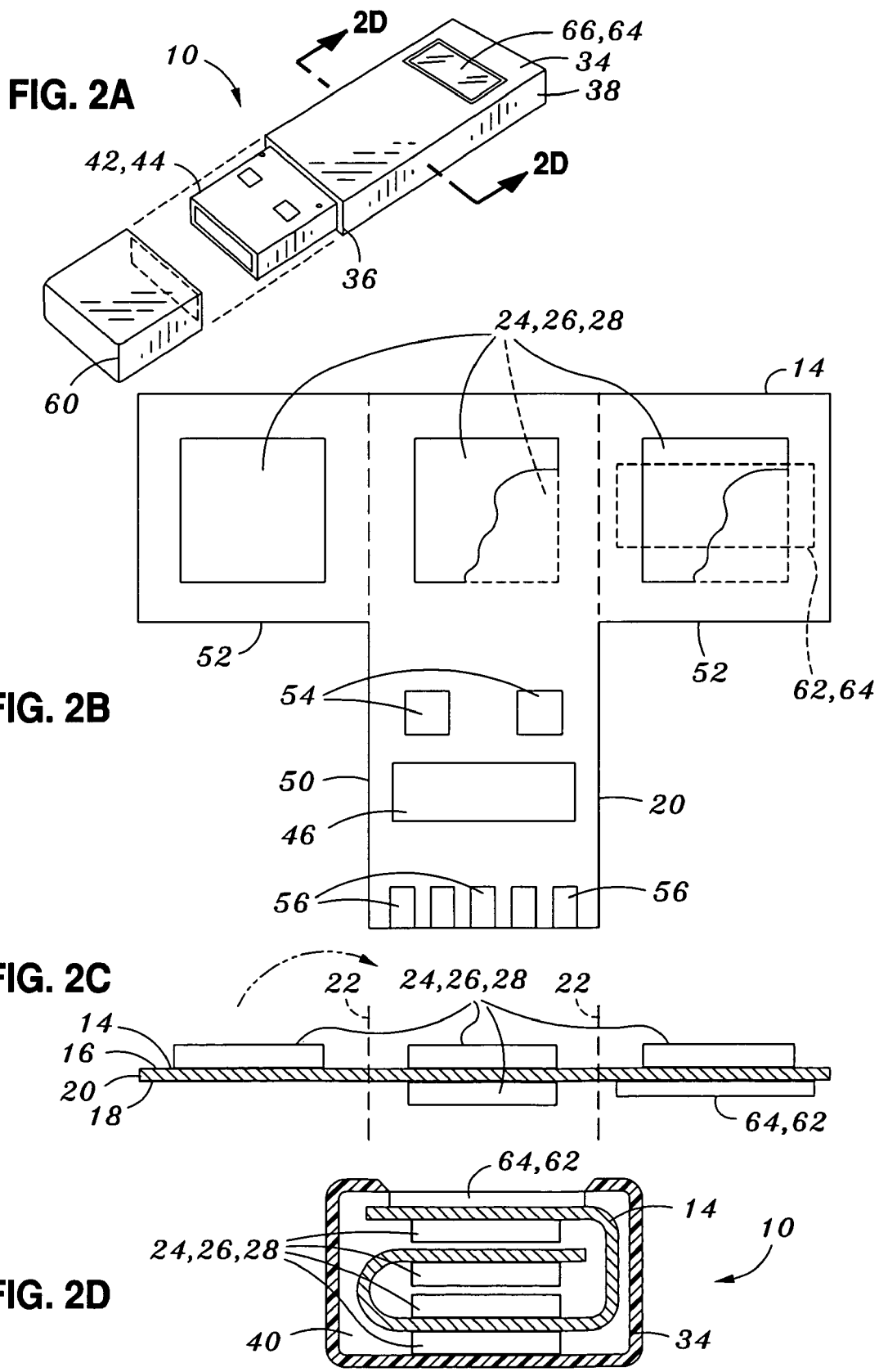

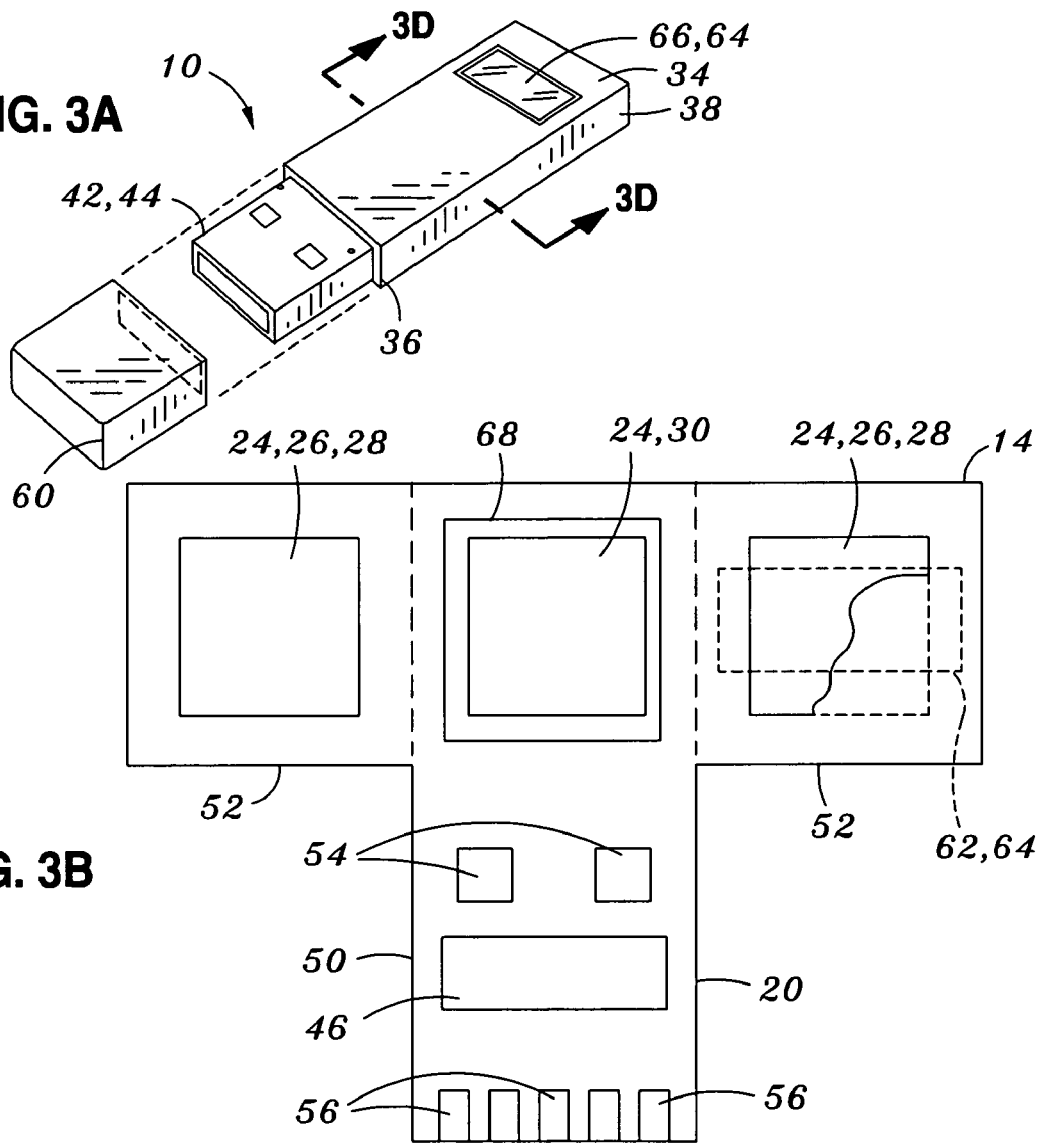
FIG. 3A
FIG. 3B
FIG. 3C
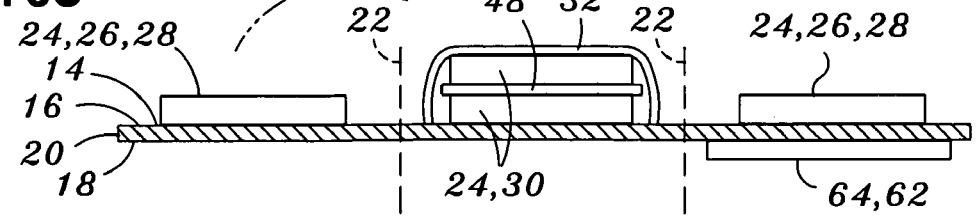
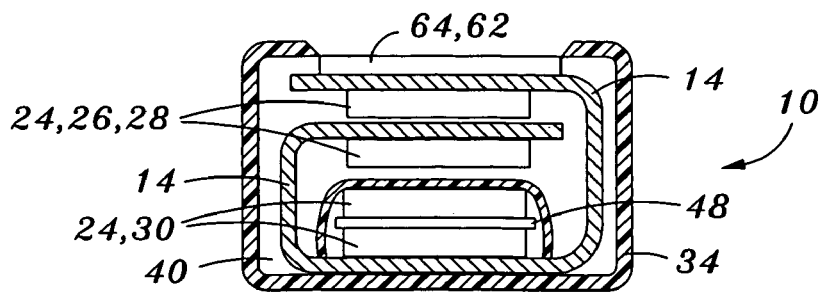
FIG. 3D

FOLDING USB DRIVE

CROSS-REFERENCE TO RELATED APPLICATIONS

Not Applicable

STATEMENT RE: FEDERALLY SPONSORED RESEARCH/DEVELOPMENT

Not Applicable

BACKGROUND

The present invention relates generally to memory devices and, more particularly, to a folding USB flash drive or memory storage device that is specifically adapted to be fabricated in an unfolded state using a thin, flexible substrate for reduced manufacturing and testing costs but which is then oriented into a folded state and assembled into a compact housing body resulting in a memory storage device having increased memory capacity.

Included in the prior art are many configurations of digital memory devices that are based on non-volatile semiconductor flash memory. Such digital memory devices typically contain one or more flash memory semiconductor integrated circuits (IC) or packages, a controller which may be integrated with the flash memory semiconductor IC, a printed wiring board substrate (PWB) and some passive components 54.

One such processor digital memory device is a USB flash drive. Such flash drives utilize flash memory which, as was earlier mentioned, is non-volatile in that no power is required in order to maintain the stored information. Unlike dynamic random access memory (DRAM), wherein all data that is in a computer's DRAM memory is lost when the computer is turned off, non-volatile memory retains data even when not powered. For example, when a flash memory device is removed from a personal data assistant (PDA), all data is maintained in the flash memory device.

It is well known that the flash memory devices are rewritable. More specifically, USB flash drives enable users to write and erase entire contents of the memory device many times. In fact, the write-cycle endurance of many flash drives enables users to rewrite the entire contents of the flash drive well beyond the life of most electronic devices with which the flash drive is used. In addition, flash memory drives can be used repeatedly with no degradation in quality. Such flash memory drives typically include a flash controller which automatically locks out bad memory cells and moves data to other sections in the memory device in order to avoid data corruption.

Other advantages of flash memory drives include the ability to function within a wide operating temperature and humidity range. The rate at which data can be stored and retried in flash memory drives is generally faster than many other memory products such as CD-ROMs and other portable storage devices such as 3½ inch floppy disks, specialized high capacity floppy disks, and tape drives. This is due in part to the fact that flash memory drives are generally solid state and do not include any moving parts.

Additionally, flash memory drives are non-magnetic and therefore not susceptible to damage from magnetic devices. Other benefits of flash memory drives are lower power consumption for longer battery life in a host device, ease of recognition by the host computer when the flash memory device is connected to the computer, the ability to connect or disconnect the flash memory device to the host computer without first powering off and then powering on the computer.

Additional important advantages of flash memory drives is their small size. Commonly referred to as pen drives due to their similarity to the length of a writing pen, many flash memory drives have the capability for storing up to one gigabite of data. For this reason, flash memory drives are a popular device for transferring data from one device to another. Some flash memory drives are shaped and sized to be connected to a key chain. Alternatively, some flash memory drives have a clip such that a user can clip the flash memory drive onto a shirt pocket.

Despite the above mentioned advantages of high storage capacity, fast data transfer rates, and optional security such as password-protected access, it is still desirable that flash memory drives have a further increased capacity in order to keep pace with the ever increasing memory demands of new electronic devices. Furthermore, it is desirable that the flash memory drives provide such increased memory capacity at a reduced manufacturing cost. More specifically, it is desirable to reduce the cost for assembly and testing of the flash memory drives. At the same time, it is desirable to keep the size of the flash memory device small as most consumers appreciate the convenience, portability and compactness of flash memory drives of the prior art.

As can be seen, there exists a need in the art for a flash memory drive that offers the convenience of high storage capacity and a compact size but which may be manufactured at a reduced cost. Furthermore, there exists a need in the art for a flash memory drive that incorporates the universal serial BUS (USB) interface that is connectable to a wide range of devices such as PC's, PDA's, and MP3 players. In addition, there exists a need in the art for a flash memory drive that conveniently packaged so that a user may transport the flash memory drive by clipping to a shirt pocket or carrying on a key chain.

BRIEF SUMMARY

The present invention addresses the above-referenced needs associated with flash memory drives of the prior art. More particularly, the present invention provides a memory device which may be configured as USB flash drive and which provides increased memory capacity but which may be manufactured at reduced cost. Such reduced manufacturing cost is due in part to the use of thin, flexible substrate laminate upon which a plurality of flash memory tips may be mounted thereupon. Importantly, the flexible substrate includes test pads and/or traces for facilitating testing of the flash memory chips prior to folding of the flexible substrate and assembly into a housing body.

The housing body is configured to house a circuit assembly which comprises the flexible substrate with the flash memory chips mounted thereupon. The housing body is generally hollow and is open on one end for insertion of the circuit assembly. A connector may be affixed to the end of the flexible substrate. A removable cap may be provided on the connector to protect the connector during transportation of the memory device.

The connector for the memory device may be provided in a variety of arrangements including, but not limited to, a universal series bus (USB) connector. Such USB connector may be in the form of an A-type USB interface, a B-type USB connector or an M-type (mini-type) USB connector.

The memory device comprises the circuit assembly with the flexible substrate having at least one memory chip mounted thereon. The flexible substrate has upper and lower surfaces with the flash memory chip being mounted on at least one of the upper and lower surfaces. Due to the flexible nature of the substrate, the circuit assembly may be oriented in an unfolded state during manufacturing and testing. In addition, the circuit assembly may be orientable in a folded state such as when assembled and inserted into the housing body.

The flexible substrate may be configured in an L-shape comprising an elongate main portion having a wing portion extending laterally outwardly therefrom. The flash memory chip may be mounted on each one of the main and wing portions and may be mounted on upper and lower surfaces thereof. In addition, passive components and a controller may be further mounted on the flexible substrate and may be conductively connected to the flash memory chips. The controller and passive components are operative to facilitate retrieval, writing and storage of memory onto the flash memory chips. A plurality of contact pads may be disposed on a free end of the main portion and are configured to engage the connector which facilitates interconnection of the flash memory device to an electronic device such as a personal computer, a laptop, a PDA, or any other electronic device.

For the wing portion, a flash memory chip may be installed on the upper and lower surfaces thereof. The flash memory chip may be generally aligned with one another. Likewise, for the main portion a pair of flash memory chips may be mounted on upper and lower surfaces. The flash memory chips may be configured in a variety of configurations including thin small outline package (TSOP) package device and/or, very very small outline package (WSOP) package device and/or a chip on board (COB) device.

Once the flash memory chips are installed on the upper and lower surfaces and following installation of the passive components and the controller, the circuit assembly may be inserted into the housing body is by first folding over the circuit assembly onto itself such that the main portion generally overlaps the wing portion, and/or vice versa. The circuit assembly is then inserted into the housing body which is preferably sized and configured to contain the circuit assembly in the folded state.

The flexible substrate may be fabricated of polyimide material although other suitable materials may be utilized. Known in the art as copper-on-polyimide flexible substrate, such material allows for the fabrication of ultra thin, high performance circuit assembly devices. Preferably, the flexible substrate has a thickness of 0.10 millimeters or less although other thickness may be utilized.

In alternative embodiments, the memory device may include the flexible substrate having a T-shape comprising an elongate main portion similar to that described above for the L-shape, but with a pair of the wing portions extending laterally outwardly from the main portion. Each one of the wing portions may have at least one flash memory chip mounted thereon. The flash memory chips for the T-shape configuration may include a pair of COB devices being mounted on the upper surfaces of the main portion in stacked arrangement. A respective one of a WSOP and/or TSOP package devices may be mounted on respective ones of the wing portions and on the upper surfaces thereof.

Optionally, a display device such as a liquid crystal display (LCD) may be mounted on the lower surface in general alignment with the flash memory chip on one of the wing portions. The LCD is preferably operative to display the amount of available memory in the memory device. The LCD is preferably conductively connected to the flash memory chips and to the controller via the flexible substrate. The controller preferably regulates the operation of the memory device and is in direct contact with the flash memory chips and other passive components as well as in contact with the contact pads.

BRIEF DESCRIPTION OF THE DRAWINGS

These and other features and advantages of the various embodiments disclosed herein will be better understood with respect to the following description and drawings in which like numbers refer to like parts throughout and in which:

FIG. 2a is a perspective view of the memory device configured as a USB flash drive in an alternative embodiment further include a display device such as an LCD display mounted so as to be externally accessible on a distal portion of the housing body;

FIG. 2b is a plan view of the flexible substrate configured in a T-shape comprising an elongate main portion and a pair of wing portions extending laterally outwardly therefrom and having a plurality of memory chips mounted thereon and further illustrating passive components and a controller mounted on the main portion of the flexible substrate;

FIG. 2c is a cross-sectional view of the circuit assembly of FIG. 2b and illustrating a pair of flash memory chips mounted on upper surfaces of the flexible substrate at the wing portions and having a pair of flash memory chips disposed on respective ones of the upper and lower surfaces of the main portion;

FIG. 2d is a cross-sectional view taken along lines 2d-2d of FIG. 2a and illustrating the circuit assembly in a folded state and further illustrating the display device being disposed in aligned orientation with a window formed in the housing body;

FIG. 3a is a perspective view of the memory device configured as a USB flash drive in an even further embodiment;

FIG. 3b is a plan view of the flexible substrate configured in the T-shape similar to that shown in FIG. 3a;

FIG. 3c is a side view of the circuit assembly shown in FIG. 3b and illustrating a pair of COB devices mounted on the upper surface of the main portion in stacked arrangement and having a glob top encapsulant extending thereover; and FIG. 3d is a cross-sectional view taken along lines 3d-3d of FIG. 3a and illustrating the circuit assembly in the folded state.

DETAILED DESCRIPTION

Figure 1A:
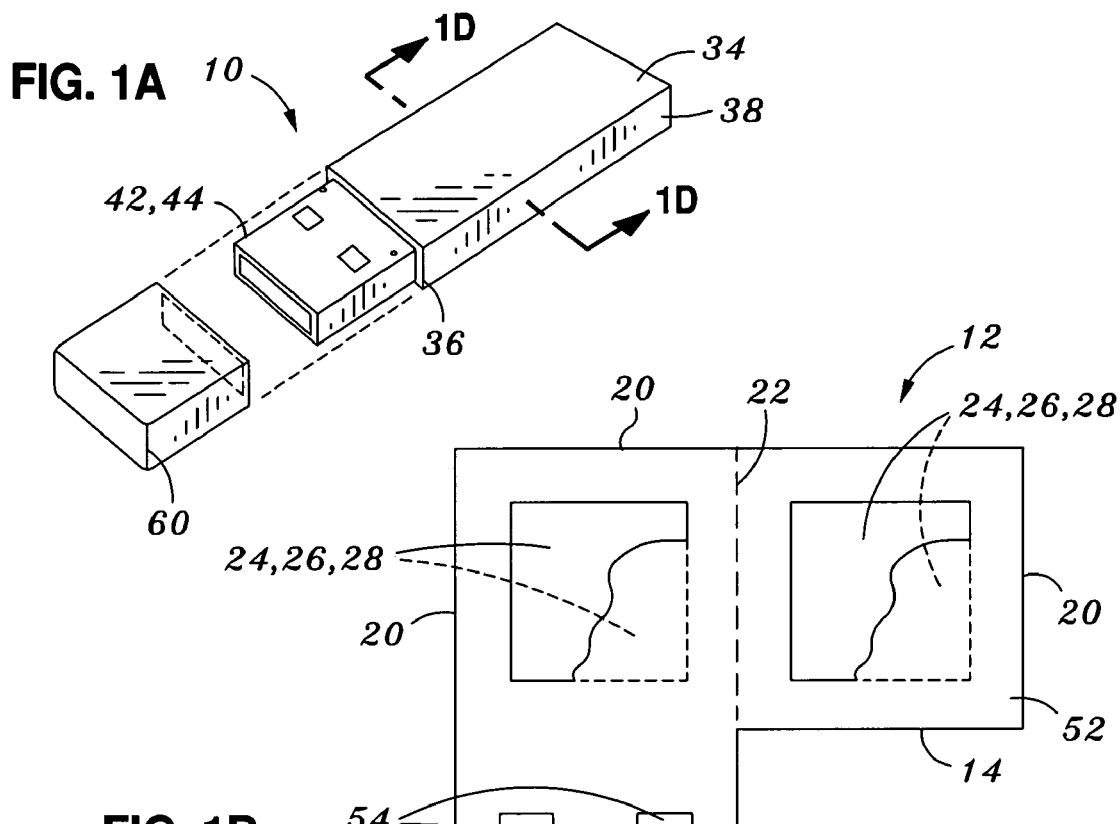
FIG. 1a is a perspective view of a memory device of the present invention configured as a USB flash drive having a cap member separately disposed from a housing body.

Referring now to the drawings wherein the showings are for purposes of illustrating the preferred embodiments of the present invention only, and not for purposes of limiting the same, FIG. 1a perspectively illustrates a memory device 10 configured as a USB flash drive constructed in accordance with the present invention. As will be discussed in more detail below, the memory device 10 is uniquely configured to provide increased memory capacity at a reduced cost due to the use of a thin, flexible substrate 14 laminate upon which flash memory chips 24 may be easily mounted side-by-side and which uses test pads or traces to facilitate testing prior to folding of the flexible substrate 14 for insertion into a housing body 34.

Figure 1B:
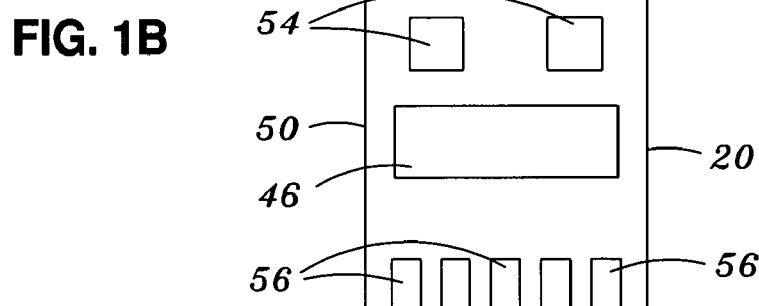
FIG. 1b is a plan view of the memory device illustrating a circuit assembly having an L-shaped flexible substrate wherein a plurality of flash memory chips are mounted on a wing portion and a main portion of the flexible substrate.

Referring briefly to FIGS. 1b, 2a, and 3a, the memory device 10 may include a housing body 34 configured to house a circuit assembly 12 having the flexible substrate 14 with the memory chip mounted thereon. The housing body 34 is configured to be generally hollow and has a proximal and a distal end 38 and being generally open on the proximal end 36 at which a connector 42 may be disposed. A housing body 34 defines an interior compartment 40 that is sized and configured to receive the circuit assembly 12 therein.

Optionally, a removable cap 60 may be included with the memory device 10 and may be configured to fit over the connector 42 for protection thereof. As is well known in the art, the cap 60 may include various means for allowing the memory device 10 to be carried. For example, the cap 60 may include a clip for securing to a pocket or, alternately, may include a lanyard for securing the memory device 10 to a key chain. Other mechanisms may be included with a cap 60 and or housing body 34 to facilitate carrying of the memory device 10.

Shown in each of FIGS. 1b, 2a, and 3a, is a connector 42 which may be configured in a variety of configurations. As is known in the art, the connector 42 is in conductive communication with the circuit assembly 12 and is configured to plug into various electronic devices. More specifically, as is known in the art, the connector 42 may include a socket at one end thereof which mates to a mating fixture on the electronic device to which the memory device 10 is to be connected. Although the connector 42 may be a universal series bus (USB) connector 44 as shown in the figures, other types of connectors 42 may be utilized.

Regarding USB connectors 44, FIGS. 1a, 2a, and 3a illustrate the memory device 10 having an A-type USB interface having a flat, wide shape. However, it is also contemplated that the connector 42 may be a B-type USB connector 44 or an M-type (mini-type) USB connector 44. Furthermore, it is contemplated that the connector 42 may be an integrated drive electronics (IDE) port or a port configured for any other type of computer interface. Regarding this type of connector 42, it should be noted that the USB connector 44 is preferably a Type 2.0 USB connector 44.

The cap 60 shown on FIGS. 1b, 2a, and 3a is configured as a protective member provided on an end of the housing body 34 and is configured to be removable therefrom in order to reveal the connector 42. Preferably, the cap 60 is configured to snap or engage onto the end of the housing body 34 during periods of non use. When the memory device 10 is connected to the electronic device, the cap 60 may simply be removed.

Referring now to FIGS. 1b-1d, 2b-2d, and 3b-3d, shown is the memory device 10 which, in its broadest sense, comprises the circuit assembly 12 having a flexible substrate 14 and at least one flash memory chip 24 mounted thereon. The flexible substrate 14 has upper and lower surfaces 16, 18 with the flash memory chip 24 being mounted on at least one of the upper and lower surfaces 16, 18. As can be seen by referring to FIGS. 1d, 3d, and 3d, the circuit assembly 12 is configured to be oriented in an unfolded state (such as during manufacturing and testing), as well as being oriented in a folded state (such as when assembled into the housing body 34).

Figure 1C:
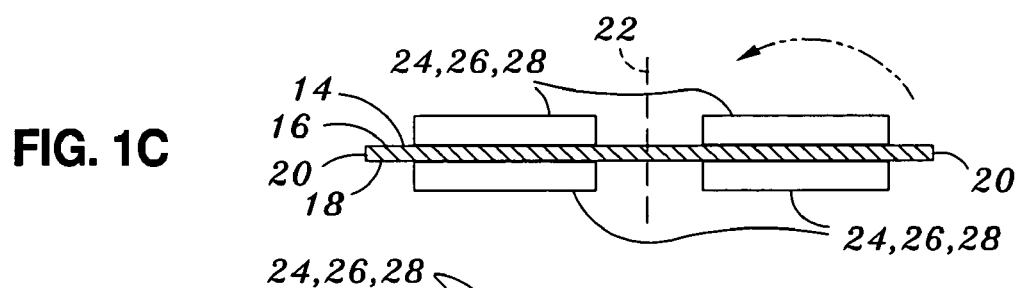
FIG. 1c is a cross-sectional view of the circuit assembly of FIG. 1b and illustrating the flexible substrate having upper and lower surfaces with a flash memory chip configured in a TSOP package device and being disposed in side-by-side arrangement on upper and lower surfaces of the flexible substrate.
Figure 1D:
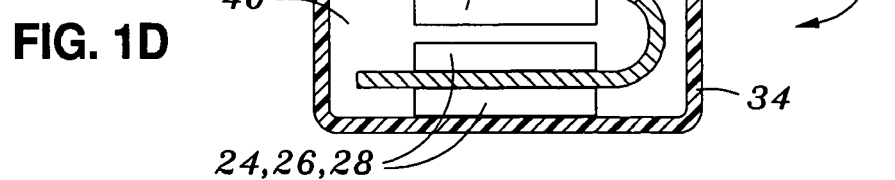
FIG. 1d is a cross-sectional view taken along line 1d-1d of FIG. 1a and illustrating the circuit assembly in a folded state and being housed within an interior compartment of the housing body.

The orientation of the circuit assembly 12 in the unfolded state is illustrated in FIG. 1c, FIG. 2c and FIG. 3c. The orientation of the circuit assembly 12 in the folded state is illustrated in FIGS. 1d, 2d and 3d. As was earlier mentioned, the ability to assemble the circuit assembly 12 in the unfolded state reduces manufacturing and testing costs by allowing for rapid testing due to the inclusion of test points 58 disposed on the sides of the flash memory chips 24 of the circuit assembly 12. After testing, the circuit assembly 12 may be oriented into the folded state and may be then inserted into the housing body 34 as shown in FIGS. 1d, 2d, and 3d.

Referring now to FIGS. 1b-1d, shown is the flexible substrate 14 configured in an L-shape bounded by peripheral edges 20. The flexible substrate 14 may be comprised of an elongate main portion 50 and having a wing portion 52 extending laterally outwardly therefrom. As can be seen in FIG. 1b, each one of the main and wing portions 50, 52 has at least one flash memory chip 24 mounted thereon. More particularly, the main portion 50 includes a pair of the flash memory chips 24 mounted on respective ones of the upper 16 and lower surfaces 18. Likewise, the wing portion 52 has a pair of the flash memory chips 24 mounted on upper 16 and lower surfaces 18.

The main portion 50 further includes passive components 54 and a controller 46 that may be interconnected with the flash memory chips 24 and may be operative to facilitate retrieval, writing and storage of memory onto the flash memory device 10. The main portion 50 may further include a series of contact pads 56 disposed on an end thereof which are configured to engage the connector 42 to facilitate interconnection of the flash memory device 10 to the electronic device (i.e., personal computer, laptop, PDA, etc.). As can be seen in FIG. 1c, the flash memory chip 24 on the upper surface 16 of the main portion 50 is disposed in general registry or aligrnent with the flash memory chip 24 on the lower surface 18.

Likewise, for the wing portion 52, the flash memory chips 24 are generally aligned. However, it is contemplated that the flash memory chips 24 may be disposed in any orientation and any juxtaposition other than that which is shown in FIG. 1c. However, to facilitate testing and manufacturing as well as facilitate folding of the circuit assembly 12 for installation into the housing body 34, it is preferable that the flash memory chips 24 are generally aligned with one another and are disposed in side-by-side arrangement.

It is contemplated that the flash memory chips 24 may be configured as a variety of memory devices 10 but may also be configured as one of a thin small outline package (TSOP) package device 26 and/or a very very small outline package (WSOP) package device and/or a chip on board (COB) device. Preferably, the configuration of the flash memory device 10 shown in FIG. 1b is configured with either the TSOP package devices 26 or WSOP package devices 28 mounted on a flexible substrate 14. Installation of the circuit assembly 12 into the housing body 34 is accomplished by first folding over the circuit assembly 12 onto itself along fold line 22 such that the main portion 50 generally overlaps the wing portion 52, and/or vice versa. The circuit assembly 12 is then inserted into the housing body 34 which is preferably sized and configured complimentary to the overall shape of a circuit assembly 12 when in the folded state.

Regarding the flexible substrate 14, it is contemplated that the flexible substrate 14 is fabricated of polyimide material although other suitable materials may be utilized. Known in the art as copper-on polyimide flexible substrate 14, such material provides ultra thin high performance circuit assembly 12 devices. The flexible substrate 14 may be fabricated in a variety of sizes and shapes and is preferably of a generally thin profile. More specifically, the flexible substrate 14 may have a thickness of 0.10 mm or less, although other thicknesses may be utilized. Typical construction of flexible substrates 14 of the type that are used in flexible circuits, chip scale packages and other products, includes a polyimide base film, a thin metal tiecoat, a copper seed coat and a layer of electrodeposited copper.

Advantages to using the flexible substrate 14 include a generally thinner overall height of the circuit assembly 12 when the flash memory chips 24 are mounted thereon due to the generally thin dimensions of the flexible substrate 14. In addition, circuit assemblies fabricated of flexible substrates 14 are generally of lighter weight than those fabricated of rigid laminate substrate as is typically used in flash memory devices 10 of the prior art. Such rigid laminate substrates are on the order of about 1.0-1.2 mm in thickness. In contrast, the flexible substrates 14 may be on the order of 0.100 mm or less.

Referring now to FIGS. 2b-2d and 3b-3d, shown is the memory device 10 wherein the flexible substrate 14 is configured in the T-shape comprising an elongate main portion 50 similar to that which is described above with reference to FIGS. 1b-1d. However, the flexible substrate 14 includes a pair of the wing portions 52 which extend laterally outwardly from the main portion 50 and which each have at least one flash memory chip 24 mounted thereon. As is described above for the embodiments shown in FIGS. 1b-1d, the embodiments of FIGS. 2b-2d are configured such that the wing portion 52 is foldable along fold line 22 over the main portion 50. Preferably, the flash memory chips 24 are generally aligned or overlap one another when oriented in the folded state. This facilitates installation of the circuit assembly 12 within the housing body 34. The flash memory chips 24 may be mounted on the upper 16 and lower surfaces 18 and at least may partially overlap one another in stacked arrangement when the circuit assembly 12 is placed in the folded state.

Further configuration of the memory device 10 shown in FIGS. 2a-2d the flash memory chips 24 may be configured as TSOP package devices 26 and/or WSOP package devices 28. However, other configurations of flash memory chips 24 may be mounted on the flexible substrate 14. Like the embodiments shown in FIGS. 1b-1d, passive components 54 as well as a controller 46 and contact pads 56 may also be disposed on the main portion 50 to facilitate communication between the flash memory chips 24 and the electronic device to which the flash memory device 10 is attached.

Referring to FIGS. 3b-3d, the flexible substrate 14 has a T-shape comprising the elongate main portion 50 with the wing portion 52 extending outwardly therefrom. However, in contrast to the embodiment of FIGS. 2a-2d, the memory device 10 shown in FIGS. 3a-3d may include a pair of COB devices 30 being mounted on the upper surface 16 of the main portion 50 in stacked arrangement. A respective one of the WSOP package device 28 and/or the TSOP package device 26 may be mounted on respective ones of the wing portions 52 on the upper surfaces 16 thereof.

On a lower surface 18 of at least one of the wing portions 52 may be a display device 62 positioned to be externally visible through the housing body 34 when the circuit assembly 12 is installed thereinto. The display device 62, which may be configured as a liquid crystal display 64 (LCD), is preferably operative to display an amount of available memory in the memory device 10. In this regard, the display device 62 is conductively connected to the flash memory chips 24 and the controller 46 via the flexible substrate 14. As was earlier mentioned, the controller 46 is mounted on the flexible substrate 14 and is preferably configured to regulate the operation of the memory device 10 by being in direct contact with the flash memory chips 24 and other passive components 54 as well as with the contact pads 56.

Referring to FIG. 3c, the COB devices 30 that are mounted on the upper surface 16 of the main portion 50 in stacked arrangement may further include a glob top encapsulant 32 which is disposed as a transfer mold resin over integrated circuits (IC) as well as wiring of each of the COB's. The glob top encapsulant 32 therefore covers the stacked arrangement of the COB devices 30. An injection mold resin may be further applied to form a top portion of the stacked arrangement of the COB devices 30. Optionally, the glob top encapsulant 32 layer may be entirely omitted with resin material being directly applied over the COB devices 30.

Referring to the flash memory chips 24 mounted on the wing portions 52 as shown in FIGS. 1b, 2b and 3b, the TSOP package devices 26 are preferably electrically connected to the flexible substrate 14 which may include conductive pads thereon to which the devices of the flexible substrate 14 may be interconnected. As was earlier mentioned, contact pads 56 such as copper/gold-plated contact pads 56 are preferably provided on the free end of the main portion 50 of the flexible substrate 14 and are preferably exposed to allow direct connection of the memory device 10 to an electronic device such as a PC.

Referring now to FIGS. 1d, 2d and 3d, shown is the housing body 34 which is generally hollow and elongate which has proximal 36 and distal ends 38. The housing body 34 is open on the proximal end 36 and defines an interior compartment 40 into which the circuit assembly 12 is installed. The interior compartment 40 is preferably sized and configured to receive the circuit assembly 12 in a generally close fit therearound in order to eliminate any undue bulkiness of the housing body 34. The housing body 34 may be fabricated of any suitable material and is preferably fabricated of a polymeric material such as plastic. As can be seen in FIGS. 1d, 2d and 3d, a spacer 48 may be provided between overlapping ones of the flash memory devices 10 to prevent contact therebetween.

As shown in FIG. 3d, the spacer 48 may further be installed between the COB devices 30 that are disposed in stacked arrangement of the upper surface 16 of the main portion 50. The glob top encapsulant 32 may therefore encapsulate the spacer 48 along with the COB devices 30. For configurations shown in FIGS. 2a-2d and 3a-3d, the housing body 34 may include a window 66 which is sized and configured complimentary to the display device 62 such as the LCD 64. In this manner, when a circuit assembly 12 is placed in the folded state and inserted into the housing body 34, the LCD 64 is preferably positioned to be aligned with the window 66 of the housing body 34 to allow exterior observation thereof.

Regarding the flash memory chips 24, as is known in the art, flash memory chips 24 may be provided in one of several varieties. For example, flash memory chips 24 may be a single level cell (SLC) flash chip which operates at high speed when reading and writing data to the flash memory chip 24. Another example of a flash memory chip 24 is a multi level cell (MLC) or multi bit cell (MBC) flash chip. The MLC flash chips generally operate at standardized speed for reading and writing data to the flash chip and are therefore more affordable and cost effective than the above referenced SLC flash chips. It is contemplated that the memory device 10 as described herein may utilize either the SLC flash chips or the MLC flash chips.

The flash memory chips 24 may further utilize NAND architecture. Advantageously, NAND flash memory chips 24 read and write data in high speed sequential modes to the memory chip. However, it is contemplated that the memory device 10 may utilize alternative storage technologies or architectures. For example, the flash memory device 10 may utilize NOR circuit architecture. However, because NAND flash memory is generally less expensive than NOR flash memory, NAND flash technology is preferred for data storage for the memory device 10 of the present invention.

As shown in FIGS. 1a, 2a and 3a, a connector 42 may be disposed on the proximal end 36 of the flexible substrate 14 and which laterally extends outwardly along the length of the main portion 50 of the flexible substrate 14. The controller 46 provides a connection interface to the electronic device to which the memory device 10 is connected (i.e., PC, PDA, MP3 device, etc.). As is well known in the art, the connector 42 includes a socket at an end thereof which mates to a mating fixture on the electronic device to which the memory device 10 is connected. The protective cap 60 may be provided on the proximal end 36 of the housing and is configured to be preferably removed therefrom when the memory device 10 is to be connected to the electronic device.

The memory device 10 preferably includes the controller 46 which interconnects the connector 42 to the memory device 10. The controller 46 may be a controller IC which is directly mounted on the flexible substrate 14 and which may have circuit traces and bond pads formed thereon for mounting of the controller 46 and of the flash memory chips 24. The flash memory chips 24 and the controller IC may be electrically connected to one another via conductive pads printed on the flexible substrate 14. However, bonding wires may alternatively be utilized to connect the flash memory chips 24 to the controller IC.

The controller 46 is preferably configured for regulating the operation of the memory device 10. The controller 46 may be configured as a micro controller 46 and may include a memory portion such as random access memory (RAM) or read only memory (ROM). The controller 46 is preferably specifically configured to regulate the flash memory chips 24 by regulating communication between the electronic device (i.e., PC, PDA) and flash memory. The controller 46 is preferably configured to access the flash memory chips 24 upon request by the electronic device and to regulate the reading of data provided from the flash memory chips 24 to the electronic device.

It is further contemplated that the controller 46 may include a security program for regulating access to the memory device 10. For example, the security program may be configured as a password-protection program wherein a predetermined code may be programmed into the controller 46. Upon entering the appropriate code to the controller 46, the controller 46 is then operative to allow data to flow between the flash memory chip 24 and electronic device. When such a password protection security program is programmed into the controller 46, a user of the memory device 10 may be prompted to enter the appropriate code when the memory device 10 is connected to the electronic device. Upon determining that the pass code entered by the user matches the predetermined pass code that is programmed into the controller 46, access to the flash memory chips 24 is allowed such that the user may read and write data to the memory device 10.

Advantageously, due to the additional capacity of the memory device 10 wherein the flash memory chips 24 are mounted on the flexible substrate 14, it is contemplated that the memory device 10 may have a capacity of about 1.5 gigabytes (gB) of storage space. However, it is further contemplated that the memory device 10 may have a storage capacity of any range. For example, the memory device 10 may have a storage capacity of up to and beyond 2 gigabytes.

However, it should be noted that transfer speeds of data between the electronic device and the memory device 10 is highly dependent upon the electronic device to which the memory device 10 is connected. For example, using a relatively quick USB flash memory device 10 on a PC that supports a relatively slow USB speed will not necessarily result in a fast data transfer rate. If the PC is configured with high speed USB 2.0 connectors 44, and the operating system of the PC includes a proper USB 2.0 driver, then high speed USB data transfers are possible if incorporated into the memory device 10.

Additional modifications and improvements in the present invention may also be apparent to those of ordinary skill in the art. Thus, the particular combination of parts described herein and illustrated herein are intended to represent only certain embodiments of the present invention and are not intended to serve as limitations of alternative devices within the spirit and scope of the invention.

What is claimed:

1. A memory device, comprising:
  a circuit assembly oriented to be in an unfolded state and a folded state and including:
  a flexible substrate having an elongate main portion and a wing portion extending laterally outwardly therefrom, the elongate main portion remaining unfolded when the circuit assembly is oriented in the folded state;
  a controller mounted on the elongate main portion;
  at least one passive component mounted on the elongate main portion;
  at least one flash memory chip mounted on the elongate main portion;
  at least another one flash memory chip mounted on the wing portion;
  wherein the wing portion being foldable over the elongate main portion when the circuit assembly is oriented in the folded state, the wing portion being foldable over an area of the elongate main portion where the controller and the at least one passive component are not vertically adjacent to the at least one wing portion flash memory chip; and
  the memory device further comprising a hollow housing body having a proximal end and a distal end and being open on the proximal end, the housing body defining an interior compartment sized and configured to receive the circuit assembly thereinto.

2. The memory device of claim 1 wherein the flash memory chip is configured as one of a thin small outline package (TSOP) package device, a very very small outline package (WSOP) package device and a chip on board (COB) device.

3. The memory device of claim 1 further comprising a universal series bus (USB) connector mounted on a free end of the elongate main portion of the flexible substrate and being configured to electrically connect the memory device to an electronic device.

4. The memory device of claim 1 wherein the flexible substrate is configured in a T-shape comprising the elongate main portion, the wing portion extending laterally outwardly therefrom and a second wing portion extending laterally outwardly from the elongate main portion;
  each one of the main and wing portions having at least one flash memory chip mounted thereon, the wing portions being foldable over the main portion.

5. The memory device of claim 3 wherein the controller mounted on the elongate main portion of the flexible substrate being conductively connected to the connector and the circuit assembly.

6. The memory device of claim 3 wherein the flexible substrate is fabricated of polyimide material.

7. A memory device, comprising:
a circuit assembly oriented to be in an unfolded state and a folded state and including:
a flexible substrate having an elongate main portion and a wing portion extending laterally outwardly therefrom, the elongate main portion being unfolded when the circuit assembly is oriented in the folded state;
a controller mounted on the elongate main portion;
at least one passive component mounted on the elongate main portion; and
a pair of flash memory chips mounted in side-by-side arrangement on the elongate main portion;
at least one flash memory chip mounted on the wing portion;
wherein the circuit assembly assumes the folded state when the flexible substrate is at least partially folded over itself, the wing portion being foldable over an area of the elongate main portion where the controller and the at least one passive components are not vertically adjacent to the at least one wing portion flash memory chip; and
the memory device further comprising a hollow housing body having a proximal end and a distal end and being open on the proximal end, the housing body defining an interior compartment sized and configured to receive the circuit assembly thereinto.

8. The memory device of claim 7 wherein the flash memory chips at least partially overlap one another in stacked arrangement when the flexible substrate is at least partially folded over itself.

9. The memory device of claim 7 wherein:
the circuit assembly further includes a pair of flash memory chips mounted in side-by-side arrangement on the lower surface;
the flash memory chips mounted on the upper and lower surfaces at least partially overlapping one another in stacked arrangement when the circuit assembly is in the folded state.

10. The memory device of claim 7 wherein:
the flexible substrate is configured in an L-shape comprising the elongate main portion and a wing portion extending laterally outwardly therefrom.

11. The memory device of claim 7 wherein:
the flexible substrate is configured in a T-shape comprising an elongate main portion and a pair of wing portions extending laterally outwardly from opposing sides of the main portion;
each one of the main and wing portions having a flash memory chip mounted on the upper surface, the wing portions being foldable over the main portion.

12. The memory device of claim 7 wherein at least one of the flash memory chips is configured as a WSOP package device.

13. The memory device of claim 7 further comprising a hollow elongate housing body having proximal and distal ends and being open on the proximal end and defining an interior compartment sized and configured to receive the circuit assembly therewithin when the circuit assembly is in the folded state.

14. The memory device of claim 7 further comprising a connector for electrically connecting the memory device to an electronic device.

15. The memory device of claim 7 further comprising a controller mounted on the flexible substrate and being configured to regulate the operation of the memory device.

16. The memory device of claim 7 further comprising:
a display device mounted on the flexible substrate and being positioned to be externally visible through the housing when the circuit assembly is installed thereinto;
the display device being operative to display an amount of available memory in the memory device.

17. The memory device of claim 10 wherein the main portion has a flash memory chip mounted on the lower surface.

18. The memory device of claim 14 wherein the connector is a universal series bus (USB) connector mounted on the proximal end.

19. The memory device of claim 16 wherein the display device is configured as a liquid crystal display (LCD).

20. The memory device of claim 17 wherein a pair of flash memory chip are configured as COB devices and being mounted on the upper surface of the main portion in stacked arrangement.

* * * * *